United States Patent [19]
Metz

[11] Patent Number: 4,551,656
[45] Date of Patent: Nov. 5, 1985

[54] OSCILLOSCOPE HAVING DUAL TIME BASE SYSTEM FOR ACCURATE DIFFERENTIAL TIME MEASUREMENT

[75] Inventor: Arthur J. Metz, Gervais, Oreg.

[73] Assignee: Tektronix, Inc., Beaverton, Oreg.

[21] Appl. No.: 437,971

[22] Filed: Nov. 1, 1982

[51] Int. Cl.[4] .......................................... G01R 13/28
[52] U.S. Cl. ................................................... 315/392
[58] Field of Search .............. 315/391, 392, 393, 394; 368/117

[56] References Cited

U.S. PATENT DOCUMENTS 3,975,684  8/1976  Mordan ................................ 368/117
4,109,182  8/1978  Dalton ................................. 368/117

Primary Examiner—Theodore M. Blum
Attorney, Agent, or Firm—George T. Noe

[57] ABSTRACT

An oscilloscope is provided with a dual time base system in which the nonlinear startup segment of the main sweep is eliminated before delay time comparison, thereby facilitating accurate differential measurements down to and including the triggering event (zero time). System delays are built in to ensure that the displayed sweep trace also begins at the left edge of the viewing screen, and, moreover, the triggering event may be viewed on both the main and delayed sweeps. The built-in system delays may be programmable to facilitate delay matching of vertical channels or time matching of independent sweep operation.

15 Claims, 3 Drawing Figures

OSCILLOSCOPE HAVING DUAL TIME BASE SYSTEM FOR ACCURATE DIFFERENTIAL TIME MEASUREMENT

BACKGROUND OF THE INVENTION

The subject matter of the present invention relates generally to oscilloscope sweep systems, and in particular to a dual time-base sweep system for accurate differential time measurements down to and including zero time, defined herein as the time base triggering event.

Conventional dual time base oscilloscopes have two sweep generators in which the starting point of a so-called delayed, or B, sweep may be selected at any time point along a so-called delaying, or A, sweep to permit expanding selected A sweep segments or making differential time measurements between certain events. It is imperative in oscillography that the time base sweep signal be linear so that the trace-producing spot is driven across the screen of the cathode-ray tube (CRT) at a constant rate of speed. For the most part, modern oscilloscopes have very linear sweeps over a specified region which excludes a short period of time following sweep initiation. The reason for this is, of course, that sweep start up immediately following sweep initiation is non-linear due to the inherent bandwidth and non-linearity of the devices of the sweep system at turn on. This nonlinear sweep startup precludes accurate differential time measurements beginning with the A-sweep triggering event because the nonlinear startup portion is necessarily included in the measurement when the delay reference is set at zero. Moreover, in most cases, the triggering event is not even visible on the delayed sweep because of the inherent delays in the A and B sweeps.

Another problem in prior art oscilloscopes is that the displayed sweep trace is shifted to the right at higher sweep speeds because the unblanking pulse must be delayed to hide the non-linear sweep startup.

SUMMARY OF THE INVENTION

In accordance with the present invention, an oscilloscope is provided with a dual time base system including an A sweep and a B sweep (delayed) in which non-linear sweep startup segments are eliminated from the measurement, thereby facilitating accurate differential measurements down to and including the triggering event ("zero time") and also ensuring that the displayed sweep trace begins at the left edge of the screen at even the highest sweep rates. For the A sweep, two delays are generated—one to allow the sweep ramp to become linear before a "zero time" comparison is made, and one to delay the display of the A sweep, which is turn permits a predetermined length to be added to the vertical delay line such that an internal triggering event can be displayed on both the A and B sweeps. The delays are generated by developing offset voltages that are proportional to the time rate of change of the A sweep ramp, and such delays are therefore independent of selected sweep speed. A circuit to develop these offset voltages includes a pair of resistors in series with a constant current source that generates a current proportional to the timing current. This current may be varied to vary the actual sweep delay. A similar delay technique may be incorporated in the B sweep generator to position the sweep start at the left edge of the CRT viewing screen at all sweep speeds, and to increase the B sweep delay in a so-called "B triggerable after A" sweep mode such that the A and B sweeps are time matched.

It is therefore one object of the present invention to provide in an oscilloscope a dual time base system for accurate differential time measurements down to the time of the occurence of the triggering event (zero time).

It is another object of the present invention to remove the nonlinear startup portion of the sweep ramp from any measurements.

It is a further object of the present invention to provide dual time base system with predetermined delays such that a triggering event can be displayed on both the A and B sweeps in an alternate sweep mode.

It is an additional object of the present invention to provide a dual time base system in which sweep delays can be dynamically modified to provide vertical delay matching or the like.

It is yet another object of the present invention to provide a sweep delaying circuit that can be programmed for different sweep delays to facilitate a variety of sweep modes.

It is a feature of the present invention to provide a dual time base system in which the displayed sweeps start at and are linear at the left edge of a viewing screen, even at the highest sweep rates.

Other objects, features, and advantages wil become apparent to those skilled in the art upon a reading of the following description when taken in conjunction with the drawings.

DETAILED DESCRIPTION OF THE INVENTION

Figure 1:
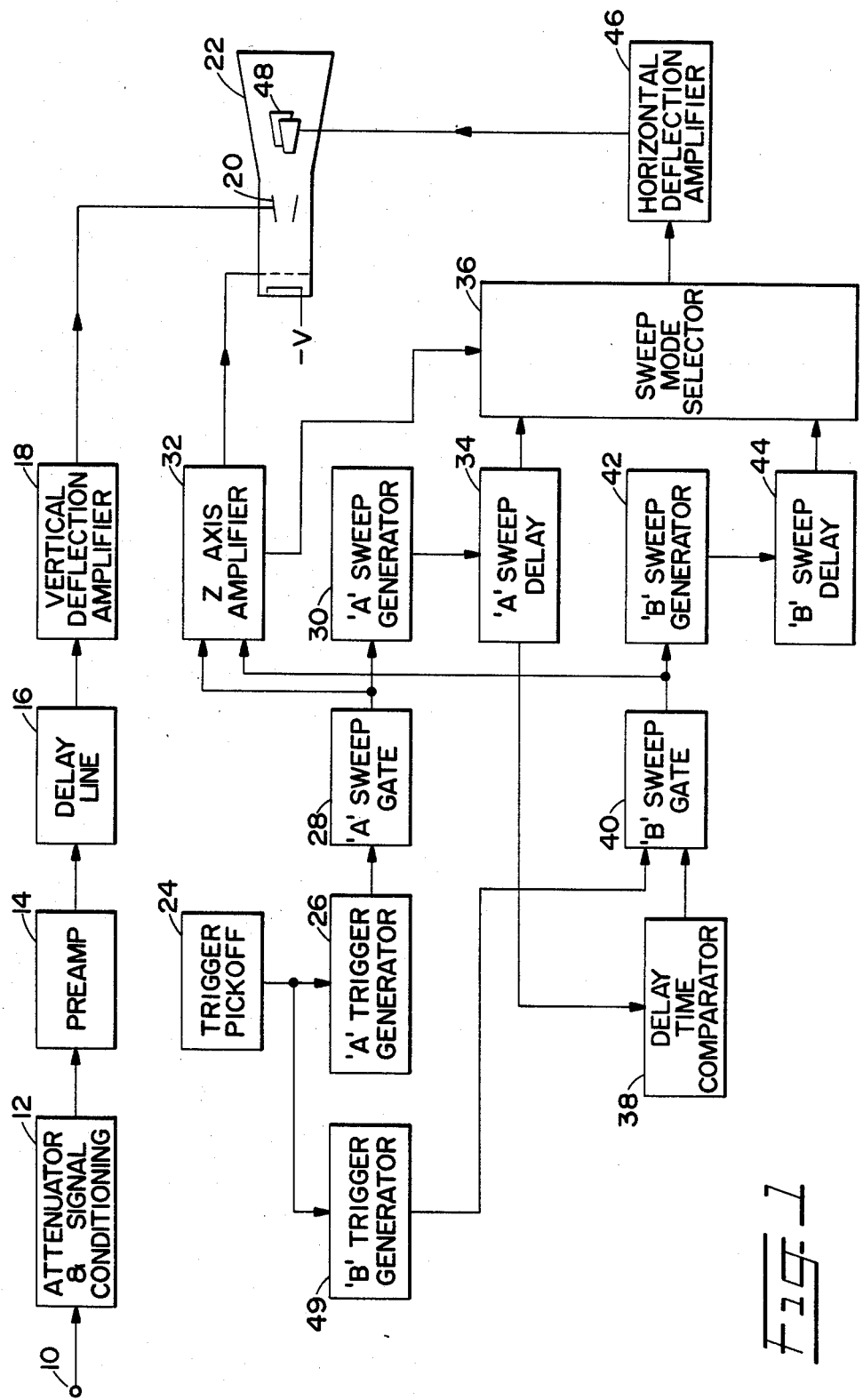
FIG. 1 is an overall block diagram of a dual time base oscilloscope in accordance with the present invention.

Referring to FIG. 1, a block diagram of a dual time base oscilloscope embodying the present invention is shown. One of a possible plurality of vertical channels, which for the most part is conventional, is shown, and comprises an input terminal 10 for receiving an electrical input signal, attenuators and signal-conditioning circuits 12, vertical preamplifier 14, delay line 16, vertical deflection amplifier 18, and vertical deflection plates 20 in a cathode-ray tube (CRT) 22.

Typically, the sweep-generating circuits may be triggered from internal, power line, or external signal sources; however, for this discussion, internal triggering will be assumed so that later a correlation may be drawn between the triggering event and the start of the delayed sweep. The internal triggering signal is derived by a suitable trigger pickoff circuit 24 from the input signal and applied to a trigger generator 26. Trigger generator 26 may suitably include a voltage-level comparator and a signal slope selector, as a common and well known in the oscillography art. At a selectable point on the input signal a triggering signal is generated by trigger generator 26 and applied to the A sweep gate circuit 28, which may suitably be a multivibrator or a digital logic gating circuit. The A sweep gate circuit 28 produces a gate signal to turn on the A sweep generator 30, and the A sweep gate signal is also routed to the Z-axis amplifier circuit 32 to turn on the CRT electron beam (referred to as unblanking the CRT). When gated on, the A sweep generator 30 produces a ramp voltage which is linear over most of its range, however, is typically nonlinear at startup. The ramp voltage is applied to an A sweep delay circuit 34, wherein the ramp voltage is actually shifted at some voltage below the level that corresponds to the left edge of the display screen. The time between actual ramp startup and when the ramp passes through the screen left-edge level (the apparent sweep start) is the delay. Of course, the sweep gate must be delayed by the same amount so that the Z-axis amplifier 32 unblanks the CRT precisely at the moment the ramp reaches the left-edge voltage level. Thus, as will be seen later in connection with FIGS. 2 and 3, the non-linear portion of the sweep is eliminated because the non-linear startup portion occurs before the apparent sweep start.

The delayed sweep ramp voltage is made available to a sweep mode selector 36. A delayed A sweep ramp voltage from the A sweep delay circuit 34 is also applied to a delay time comparator 38 where it is compared with a selectable precise reference level to generate a B sweep trigger a precise time delay after initiation of the A sweep. It should be noted that the delay of the A sweep ramp to the delay time comparator 38 may not be the same as the delay of the A sweep ramp to be applied via the sweep mode selector 36 to the deflection system. Upon receipt of the B sweep trigger produced by delay time comparator 38, the B sweep gate circuit 40 generates a gating signal to turn on the B sweep generator 42 to produce a B sweep ramp voltage, which may then be delayed by a predetermined amount of time by B sweep delay circuit 44 and made available to the sweep mode selector 36. The sweep mode selector 36 selects either the A or B sweep ramp voltage, which is split into a differential signal and amplified by horizontal deflection amplifier 46 to levels suitable to drive horizontal deflection plates 48 in a linear fashion. The B sweep gate signal from the B sweep gate circuit 40 is also applied to the Z-axis amplifier circuit 32 to control CRT beam intensity in the conventional manner. A 'B' trigger generator 49 is shown to illustrate that other sweep modes than delayed sweep may be available, such as, for example, independent B sweep operation or B Triggerable After A mode.

The delay times resulting in the A and B sweep delay circuits 34 and 44, respectively, are controllable. Also, it may be assumed that delay line 16 is a little longer than usually encountered in the vertical channel of an oscilloscope, so that the A sweep triggering event may be delayed so as to arrive on-screen after both the A and B sweeps have started. That is, the A and B sweeps may be adjusted so that the same A triggering event is visible on both the A and B sweeps or may be adjusted so that they appear in precise time registration on both sweeps. Thereafter, differential time measurement may be made with a high degree of accuracy. Typically the differential measurement is made by displaying the triggering event (for example, the leading edge of a pulse) on a first B sweep by setting the first B sweep delay control to "zero". Then a second event is dialed in on a second B sweep by adjusting a second B sweep delay control to overlay the two events. The differential time may be readout in any conventional manner.

Figure 2:
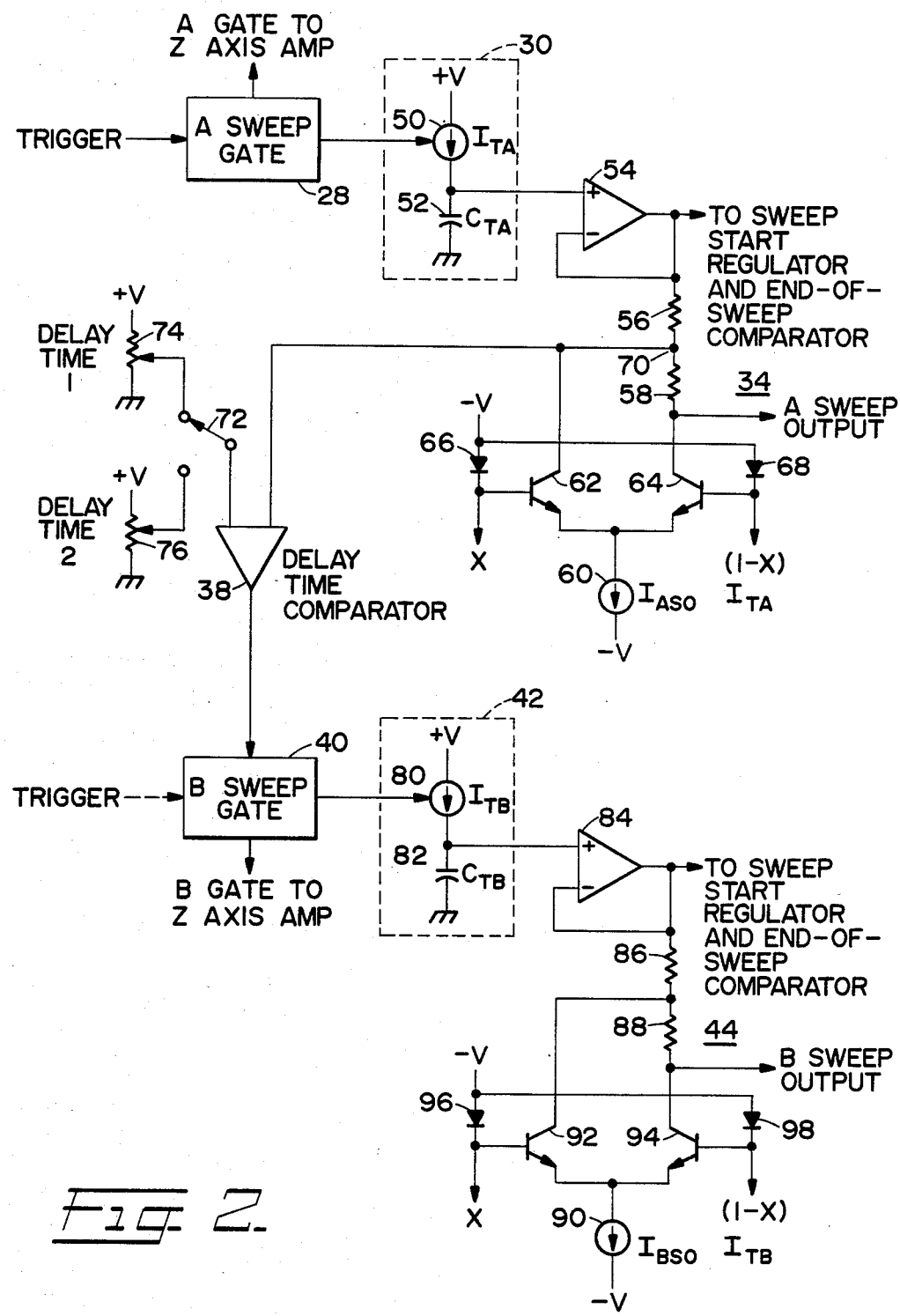
FIG. 2 is a detailed circuit of a dual time base system in accordance with the present invention.

The sweep-generating circuits and their associated time delays will be described with reference to FIGS. 2 and 3. In FIG. 2, the A sweep gate circuit 28 receives a trigger as described above, and generates a gate signal which is applied to the A sweep generator 30. While the A sweep generator 30 may take many forms, such as Miller integrators and the like, a constant current source 50 in series with a capacitor 52 is shown for simplicity. And of course, current source 50 and capacitor 52 may actually include a number of current sources of capacitances in any desired combination to establish a desired number of selectable sweep rates. It is sufficient for this description that current source 50 is gated on by the A sweep gate signal and the constant current $I_{TA}$ therefrom flows into capacitor 52, producing a linearly rising ramp voltage thereacross. Not shown is any reset circuit which removes the charge on the capacitor at sweep termination; however, such reset circuits are well within the purview of the one having ordinary skill in the art.

The A sweep delay circuit 34 comprises a voltage follower buffer amplifier 54, a pair of serially connected resistors 56 and 58, a constant current sink 60, and a linear multiplier represented by emitter-coupled transistors 62 and 64 and associated diodes 66 and 68. The constant current sink 60 sinks an A sweep output current $I_{ASO}$ which is proportional ($\alpha$) to the A timing current $I_{TA}$ produced by current source 50. A differential control signal represented by X and $(1-X)$ is applied to the bases of transistors 62 and 64 to proportionately divide the current $I_{ASO}$ therethrough; however, all of the current $I_{ASO}$ is summed at node 70 so that the current through resistor 56 is a constant $I_{ASO}$ while the current through resistor 58 is a variable $(1-X)I_{ASO}$. Thus it follows that the voltage drop $V_{DC}$ across resistor 56 is fixed, while the voltage drop $(V_{ASDO}-V_{DC})$ across resistor 58 is adjustable.

Figure 3:
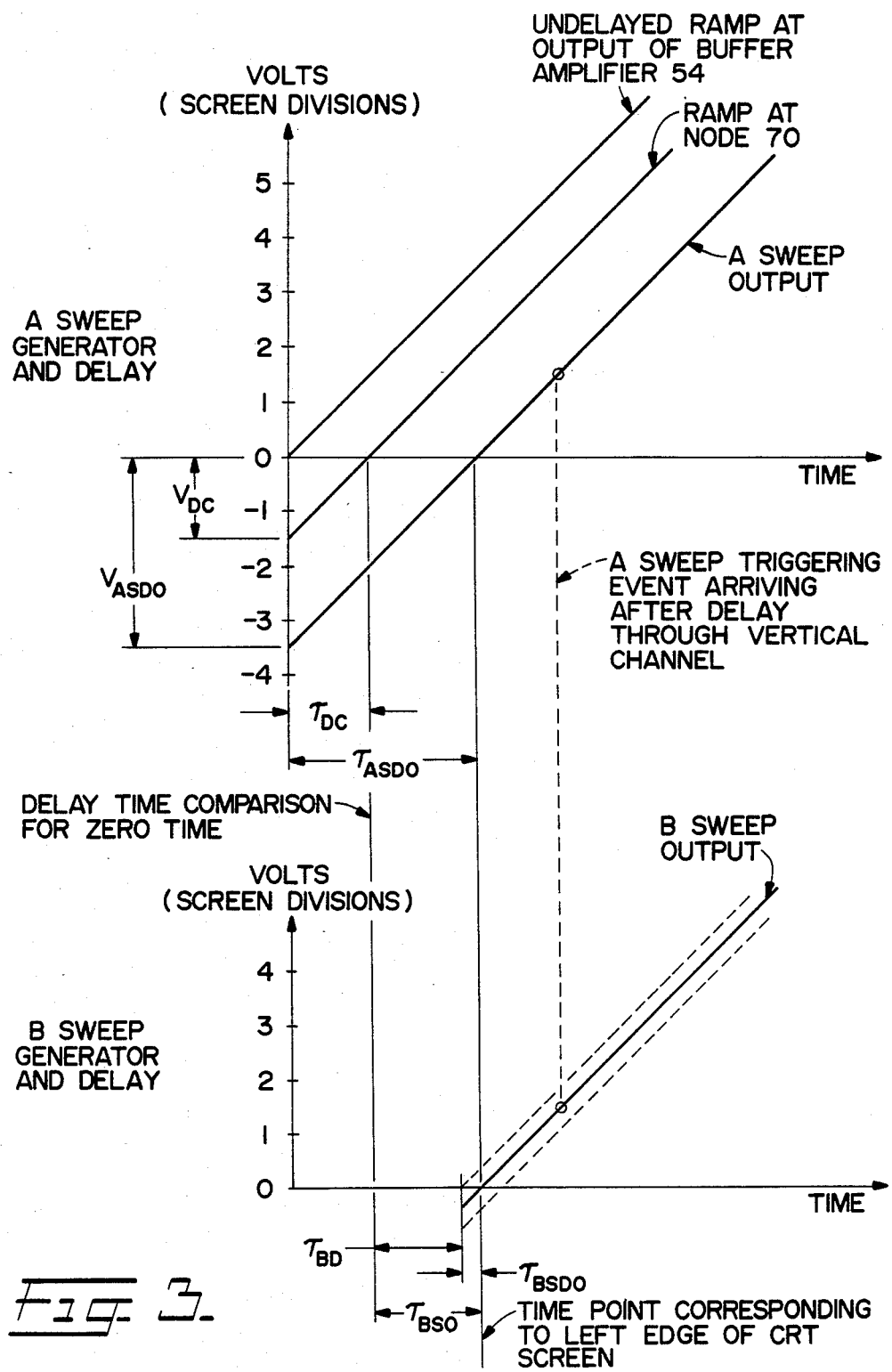
FIG. 3 shows voltage-versus-time plots for both the A and B sweeps for explaining the present invention.

Now refer to FIG. 3, which shows graphs of the A and B sweep ramp voltages plotted against a time axis. Note that the undelayed A sweep ramp voltage at the output of buffer amplifier 54 begins at the zero volts (or zero graticule line at the left edge of the CRT screen), and that the ramp voltage is actually shifted because of the voltage drops across resistors 56 and 58. Because the shifted ramps cross the zero line later in time than capacitor 52 actually begins to charge, a delay is effected. From a glance at FIG. 3, it can be seen that the voltage drop $V_{DC}$ across resistor 56 translates to a delay time $\tau_{DC}$, and the voltage drop across both resistor 56 and 58 ($V_{ASDO}$) translates to a delay time $\tau_{ASDO}$. The ramp that is shifted by $V_{ASDO}$ is the A sweep delayed output, which is taken from the collector of transistor 64 and made available to the horizontal deflection system via sweep mode selector 36. It should be mentioned that the A sweep gate to the Z axis amplifier 32 must be delayed by the same time $\tau_{ASDO}$ so that the CRT becomes unblanked just as the A sweep output ramp crosses the zero line. Also, since the current $I_{ASO}$ is always proportional to the current $I_{TA}$, the delay $\tau_{ASDO}$ is fixed for every sweep rate, so that the sweep begins at the left edge of the CRT screen as higher sweep rates are selected rather than the sweep start point annoyingly "walking" across the screen (shifting to the right) as higher rates are selected, thus eliminating the necessity to reposition the sweep start at the faster sweeps.

The shifted A sweep ramp voltage at node 70 is applied to one input of delay time comparator 38. Connected to the other input of delay time comparator 38 via a selector switch 72 is a first potentiometer 74 and a second potentiometer 76. Switch 72 may suitably be an electronic switch, such as a transsistor, or FET switch and hence may be programmable. Potentiometers 74 and 76 depict that two different delay times may be selected, one of which may be differential time to permit differential (Δ) time measurements, between a pair of selected events as taught in U.S. Pat. No. 4,109,182 to Oliver Dalton and assigned to the assignee of the present application. The reason that the A sweep ramp voltage is shifted by the fixed voltage drop $V_{DC}$ across resistor 56 before applying it to the delay time comparator 38 is to allow the ramp to become linear before a "zero time" comparison is made. To understand this more fully, note that potentiometer 74, for example, has an adjustment range from ground (zero volts) to some positive voltage level $+V$ which is equal to at least the peak sweep ramp voltage expected so that any point on the ramp may be selected for making a time comparison. However, for this description, the point of interest is when the slider of potentiometer 74 is set to the grounded end of the potentiometer range, which corresponds to a point in time previous to the triggering event. Note also from a perusal of FIG. 3 that the ramp at node 70 starts out at some negative voltage ($-V_{DC}$) and subsequently becomes linear before passing through the zero-volt level after a time delay $\tau_{DC}$, at which time the delay time comparator 38 switches to produce at the output thereof a B sweep trigger.

The B sweep trigger is applied to the B sweep gate circuit 40, which turns on constant current source 80 in B sweep generator 42, allowing timing capacitor 82 to begin to charge, initiating the B sweep ramp. There are inherent delays in the B sweep system, including delays in the comparator 38, B sweep gate circuit 40, and in the sweep generator itself. These delays are represented in FIG. 3 by the term $\tau_{BD}$. The B sweep delay circuit 44 allows adjustment of the B sweep start to the left edge of the CRT viewing screen for time matching purposes or to remove startup nonlinearites.

The B sweep delay circuit 44 comprises a voltage follower buffer amplifier 84, a pair of serially connected resistors 86 and 88, a constant current sink 90, and a linear multiplier represented by emitter-coupled transistors 92 and 94 and asssociated diodes 96 and 98. The constant current sink 90 sinks a current $I_{BSO}$ which is proportional to the B timing current $I_{TB}$. The multiplier circuit permits adjustment of current through resistor 88 in the same manner described hereinabove for the A sweep delay. Resistor 86 may be optional, and may be chosen to provide whatever fixed delay is necessary. The adjustment of current through resistor 88 provides an adjustment range of the shifting of the B sweep output as depicted by the dashed lines adjacent the ramp in FIG. 3. The delay $\tau_{BSDO}$ of the B sweep circuit may be adjusted such that the B sweep ramp is linear when it reaches zero volts, or the left edge of the viewing screen. An A triggering event (or other electrical event) may be suitably delayed through the vertical channel to appear on screen at some point in time on the A sweep, and if the B sweep is time-matched with the A sweep (same sweep rates, for example), it would be ideal but not critical that the same event may be overlayed on both displayed sweeps to permit accurate differential time measurements to be made, even for intervals beginning with the A sweep triggering event. While FIG. 3 shows the time point of the start of both the A and B sweeps coinciding, the only criticality is that the triggering event appear somewhere on the B sweep because the differential measurements are made on alternating B sweeps.

In summary, three delays $\tau_{DC}$, $\tau_{ASDO}$, and $\tau_{BSD}$ are generated by developing offset voltages that are proportional to the rate of change (dv/dt) of the respective sweep ramps, and are independent of the sweep speed selected. The delay time $\tau_{DC}$ allows the A sweep to become linear before a time comparison is made by comparator 38. The delay time $\tau_{ASDO}$ delays the display of the A sweep to allow a sufficient length of vertical delay line to be added such that the triggering event can be displayed on both the A and B sweeps. The delay time $\tau_{BSDO}$ is chosen to cover the B sweep startup nonlinearity and to position the B sweep starting point. Of course, it should be mentioned that the differential signals applied to linear multipliers may be applied to appropriate circuitry in the Z axis amplifier 32 to permit a corresponding adjustable delay of the A and B sweep gates so that the CRT electron beam turns on as a respective ramp passes through the zero-volt level corresponding to the left edge of the viewing screen. In a proposed commercial embodiment $\tau_{DC}$ was chosen to be about 10 nanoseconds, and $\tau_{ASDO}$ was chosen to be adjustable from about 12 nanoseconds to about 25 nanoseconds. The important consideration here is to provide enough delay to the A sweep display such that both the A and B sweep displays of the triggering event are satisfactory at the higher sweep speeds.

A further feature of the present invention is that the differential signal applied to the linear multipliers in the delay offset circuits may be changed either by a potentiometer or by a dynamic signal. Thus, for example, the delay $\tau_{ASDO}$ could be switched electronically while alternating between two or more vertical channels to effectively null out delay differences in those channels. Moreover, the delay $\tau_{BSDO}$ could be switched electronically to provide delay matching with A sweep in certain sweep modes, such as B triggerable after A mode.

While there has been shown and described the preferred embodiment according to the present invention, it will be apparent to those skilled in the art that many changes and modifications may be made without departing from the invention in its broader aspects. For example, resistors 58 and 88 could be replaced with delay lines; however, delay lines are not preferred because of attendant bulk, non-adjustability, and possible distortion-producing mechanisms. It is therefore contemplated that the appended claims will not be construed in a limiting sense and will cover any such modifications or embodiments as fall within the true scope of the invention.

What I claim as being novel is:

1. A time base system for an oscilloscope, comprising a first sweep generator for generating a first sweep ramp voltage;

means coupled to the output of said first sweep generator for shifting said first sweep ramp voltage in such a manner that a level comparison may be made on said first sweep ramp voltage after at least a predetermined time duration so as to effect a predetermined first delay thereof;

means for providing a second delay of said first sweep ramp voltage;

a second sweep generator responsive to said level comparison of said first delayed first sweep ramp voltage for generating a second sweep ramp voltage; and means for selectively applying said second delayed first sweep ramp voltage and said second sweep ramp voltage to the horizontal deflection system of said oscilloscope.

2. A time base system in accordance with claim 1 wherein said first sweep ramp voltage shifting means comprises a first resistor coupled between the output of said first sweep generator and a current source.

3. A time base system in accordance with claim 2 wherein said second delay means comprises a second resistor serially disposed between said first resistor and said current source.

4. A time base system in accordance with claim 3 further comprising delay-establishing means for varying the voltage across said second resistor thereby to effect a variable second delay while maintaining a fixed voltage drop across said first resistor.

5. A time base system in accordance with claim 4 wherein said delay-establishing means comprises a current multiplier having a pair of complementary current outputs wherein one of said pair of current outputs is coupled to the junction of said first and second resistors and the other of said pair of current outputs is coupled to the other end of said second resistor in such a manner that current from said current source may be varied through said second resistor and all of said current from current source summed at the junction of said first and second resistors to pass through said first resistor.

6. A time base system in accordance with claim 5 wherein said current multiplier is programmable.

7. A time base system in accordance with claim 1 further comprising means for delaying said second sweep ramp voltage.

8. An oscilloscope having at least one vertical channel and a dual time base for displaying an input signal on a viewing screen, comprising:
a first sweep generator for producing a first sweep signal and a second sweep generator for producing a second sweep signal;
means for independently delaying said first and second sweep signals over variably controllable respective delay ranges; and
means for selectively connecting said delayed first and second sweep signals to a horizontal deflection system of said oscilloscope.

9. An oscilloscope in accordance with claim 8 wherein said means for independently delaying said first and second sweep signals includes electronic means for dynamically changing said delays to accomodate different operating modes of said oscilloscopes.

10. An oscilloscope in accordance with claim 9 wherein said means for independently delaying said first and second sweep signals is programmable.

11. An oscilloscope in accordance with claim 8 further comprising means for deriving a first trigger signal from a triggering event of said input signal to initiate said first sweep signal; means for shifting said first sweep signal by a predetermined amount; and means responsive to a selected reference voltage in comparison with said shifted first sweep signal to initiate said second sweep, such that said triggering event may be displayed on said viewing screen for both of said delayed first and second sweeps.

12. An oscilloscope in accordance with claim 11 wherein said means for shifting said first sweep signal comprises a first impedance element in series with a current source.

13. An oscilloscope in accordance with claim 12 wherein said means for delaying said first and second sweeps comprises a second and a third impedance element, respectively, and means for varying the current through said second and third impedance elements.

14. An oscilloscope in accordance with claim 13 wherein said current-varying means comprises a multiplier for each of said second and third impedance elements.

15. An oscilloscope in accordance with claim 14 wherein said multipliers are controllable by control signals applied thereto.

* * * * *